(12) United States Patent
Chen et al.

(10) Patent No.: US 10,769,978 B2
(45) Date of Patent: Sep. 8, 2020

(54) DETECTION SIGNAL SELECTING CIRCUIT, THIN FILM TRANSISTOR SUBSTRATE, AND DISPLAY PANEL

(71) Applicant: Wuhan China Star Optoelectronics Semiconductor Display Technology Co., Ltd., Wuhan, Hubei (CN)

(72) Inventors: Caiqin Chen, Guangdong (CN); Yiyi Wang, Guangdong (CN); Shaobo Wang, Guangdong (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 193 days.

(21) Appl. No.: 16/115,533

(22) Filed: Aug. 28, 2018

(65) Prior Publication Data

US 2019/0333432 A1   Oct. 31, 2019

Related U.S. Application Data

(63) Continuation of application No. PCT/CN2018/096198, filed on Jul. 19, 2018.

(30) Foreign Application Priority Data

Apr. 28, 2018   (CN) .......................... 2018 1 0400789

(51) Int. Cl.
*G11C 19/00*   (2006.01)
*G09G 3/20*   (2006.01)
(Continued)

(52) U.S. Cl.
CPC ............. *G09G 3/20* (2013.01); *H01L 27/124* (2013.01); *G09G 3/3677* (2013.01);
(Continued)

(58) Field of Classification Search
None
See application file for complete search history.

(56) References Cited

U.S. PATENT DOCUMENTS 3,894,248 A * 7/1975 Asaoka ................. G11C 19/28
377/78
7,427,971 B2   9/2008 Eom
(Continued)

FOREIGN PATENT DOCUMENTS

CN   107274832 A   10/2017

*Primary Examiner* — Tuan T Lam (57) ABSTRACT

The selecting circuit includes first and second switch units. The first switch unit includes a first control terminal, a first input terminal, and a first output terminal. The second switch unit includes a second control terminal, a second input terminal, and a second output terminal. The first output terminal connects to the second output terminal, the first input terminal connects to an output terminal of a first-stage of driving units, the second input terminal connects to an output terminal of a last-stage of the driving units. A first control signal inputted from the first control terminal controls the first switch unit to be turned on or off, a second control signal inputted from the second control terminal controls the second switch unit to be turned on or off, to selectively output an output signal of first or second output terminals based on an output sequence of the scan driving signal.

20 Claims, 5 Drawing Sheets

(51) Int. Cl.
*H01L 27/12* (2006.01)
*G09G 3/36* (2006.01)
*G11C 19/28* (2006.01)

(52) U.S. Cl.
CPC ........... *G09G 2300/0426* (2013.01); *G09G 2300/0809* (2013.01); *G09G 2310/0264* (2013.01); *G09G 2310/0286* (2013.01); *G09G 2310/08* (2013.01); *G11C 19/28* (2013.01)

(56) References Cited

U.S. PATENT DOCUMENTS

| | | | |
|---|---|---|---|
| 7,965,272 B2 | 6/2011 | Eom | |
| 9,177,502 B2 | 11/2015 | Jang et al. | |
| 9,595,215 B2 | 3/2017 | Yang et al. | |
| 9,665,226 B2 | 5/2017 | Hu et al. | |
| 9,734,754 B2 | 8/2017 | Ohara et al. | |
| 9,864,472 B2 | 1/2018 | Yang et al. | |
| 2005/0195151 A1* | 9/2005 | Ko | G09G 3/006 345/100 |
| 2006/0098525 A1* | 5/2006 | Kim | G09G 3/006 365/244 |
| 2006/0145996 A1* | 7/2006 | Chang | G09G 3/006 345/98 |
| 2008/0049000 A1* | 2/2008 | Kim | G09G 3/3677 345/204 |
| 2009/0267924 A1* | 10/2009 | Shimizu | G09G 3/3677 345/204 |
| 2010/0214206 A1* | 8/2010 | Yokoyama | G09G 3/3677 345/100 |
| 2011/0096027 A1* | 4/2011 | Jeon | G06F 3/0412 345/175 |
| 2015/0109018 A1* | 4/2015 | Ma | G09G 3/3677 324/760.02 |
| 2015/0348486 A1* | 12/2015 | Suzuki | G09G 3/3677 345/174 |
| 2016/0071614 A1* | 3/2016 | Lee | G09G 5/006 345/214 |
| 2016/0247430 A1* | 8/2016 | Cho | G09G 3/006 |
| 2017/0235421 A1* | 8/2017 | Lin | G02F 1/134309 345/173 |
| 2019/0197978 A1* | 6/2019 | Wu | G09G 3/3677 |
| 2019/0207600 A1* | 7/2019 | Du | G09G 3/3677 |
| 2019/0237036 A1* | 8/2019 | Kurihara | G02F 1/136286 |

* cited by examiner

DETECTION SIGNAL SELECTING CIRCUIT, THIN FILM TRANSISTOR SUBSTRATE, AND DISPLAY PANEL

CROSS-REFERENCE TO RELATED APPLICATIONS

The present application is a continuation-application of International (PCT) Patent Application No. PCT/CN2018/096198, filed Jul. 19, 2018 which claims foreign priority of Chinese Patent Application No. 201810400789.8, filed on Apr. 28, 2018 in the State Intellectual Property Office of China, the contents of all of which are hereby incorporated by reference.

TECHNICAL FIELD

The present disclosure relates to the field of display technologies, and more particularly, to a detection signal selecting circuit, a thin film transistor substrate, and a display panel.

BACKGROUND

Existing display devices generally are provided with scan driving circuits for outputting a scan driving signal to drive pixel circuits to work. The scan driving circuit typically has multi-stages driving units, and each stage of the driving units may output a scan driving signal. It may be determined whether the scan driving circuit goes wrong by detecting a discrepancy between a first scan driving signal and a last scan driving signal outputted from the scan driving circuit. In existing detection manners, an output terminal of a last stage of the scan driving circuits is connected to an output terminal, and it is detected whether an output signal is abnormal by using an oscilloscope. However, the existing detection manners are only applicable to display devices for unidirectional scanning, and the existing detection manners can only satisfy detection in one scanning direction even though the display devices are used for bidirectional scanning.

SUMMARY

A technical problem mainly solved by the present disclosure is to provide a detection signal selecting circuit and a method, a thin film transistor substrate, and a display panel, which can solve a problem that existing detection methods are only applicable to display devices for unidirectional scanning.

To solve the above technical problem, the present disclosure adopts a technical solution as below. There is provided a detection signal selecting circuit, which is used in a scan driving circuit of a display panel. The scan driving circuit includes multi-stages driving units, and each stage of the driving units outputs a scan driving signal. The detection signal selecting circuit includes a first switch unit and a second switch unit. The first switch unit includes a first control terminal, a first input terminal, and a first output terminal. The second switch unit includes a second control terminal, a second input terminal, and a second output terminal. The first output terminal connects to the second output terminal, the first input terminal connects to an output terminal of a first-stage of the driving units, and the second input terminal connects to an output terminal of a last-stage of the driving units. A first control signal inputted from the first control terminal controls the first switch unit to be turn on or off, and a second control signal inputted from the second control terminal controls the second switch unit to be turn on or off, so as to selectively output an output signal of the first output terminal or an output signal of the second output terminal based on an output sequence of the scan driving signal. The first switch unit includes a first thin film transistor, which includes a first gate, a first source, and a first drain. The first gate connects to the first control terminal, the first source or the first drain connects to the first input terminal, and the other one of the first source and the first drain connects to the first output terminal. The second switch unit includes a second thin film transistor, which includes a second gate, a second source, and a second drain. The second gate connects to the second control terminal, the second source or the second drain connects to the second input terminal, and the other one of the second source and the second drain connects to the second output terminal.

To solve the above technical problem, the present disclosure adopts another technical solution as below. There is provided a thin film transistor substrate, which includes a scan driving circuit and a detection signal selecting circuit connected to one another. The scan driving circuit includes multi-stages driving units, and each stage of the driving units outputs a scan driving signal. The detection signal selecting circuit includes a first switch unit and a second switch unit. The first switch unit includes a first control terminal, a first input terminal, and a first output terminal. The second switch unit includes a second control terminal, a second input terminal, and a second output terminal. The first output terminal connects to the second output terminal, the first input terminal connects to an output terminal of a firststage of the driving units, and the second input terminal connects to an output terminal of a laststage of the driving units. A first control signal inputted from the first control terminal controls the first switch unit to be turned on or off, and a second control signal inputted from the second control terminal controls the second switch unit to be turned on or off, so as to selectively output an output signal of the first output terminal or an output signal of the second output terminal based on an output sequence of the scan driving signal.

To solve the above technical problem, the present disclosure adopts still another technical solution as below. A display panel is provided, which at least includes the aforementioned thin film transistor substrate.

Beneficial effects of the present disclosure are as below. In contrast with the prior art, by way of a selective switch of a first switch unit and a selective switch of a second switch unit, the detection signal selecting circuit according to a part of embodiments of the present disclosure may selectively output an output signal of the first output terminal or an output signal of the second output terminal based on an output sequence of the scan driving signal. The output signal of the first output terminal is a scan driving signal outputted from the first-stage of the driving units, and the output signal of the second output terminal is a scan driving signal outputted from the last-stage of the driving units. The detection signal selecting circuit may select to enable the second switch unit to output the scan driving signal outputted from the last-stage of the driving units when performing a forward scanning, namely, when the output sequence of the scan driving signal is from the first-stage of the driving units to the last-stage of the driving units. Whereas the detection signal selecting circuit may select to enable the first switch unit to output the scan driving signal outputted from the first-stage of the driving units when performing a backward scanning. In this way, the last outputted scan driving signal can be outputted in bidirectional scanning (i.e., the forward scanning and the backward scanning), and thus detection of the scan driving circuit in bidirectional scanning may be implemented.

DETAILED DESCRIPTION

A clear and complete description of the technical schemes in the embodiments of the present disclosure will be made below with reference to the accompanying drawings in the embodiments of the present disclosure. Apparently, the embodiments as recited herein are merely a part of embodiments of the present disclosure instead of all embodiments. All other embodiments obtained by a person of ordinary skill in the art based on the embodiments of the present disclosure without creative efforts shall fall within the protection scope of the present disclosure.

Figure 1:
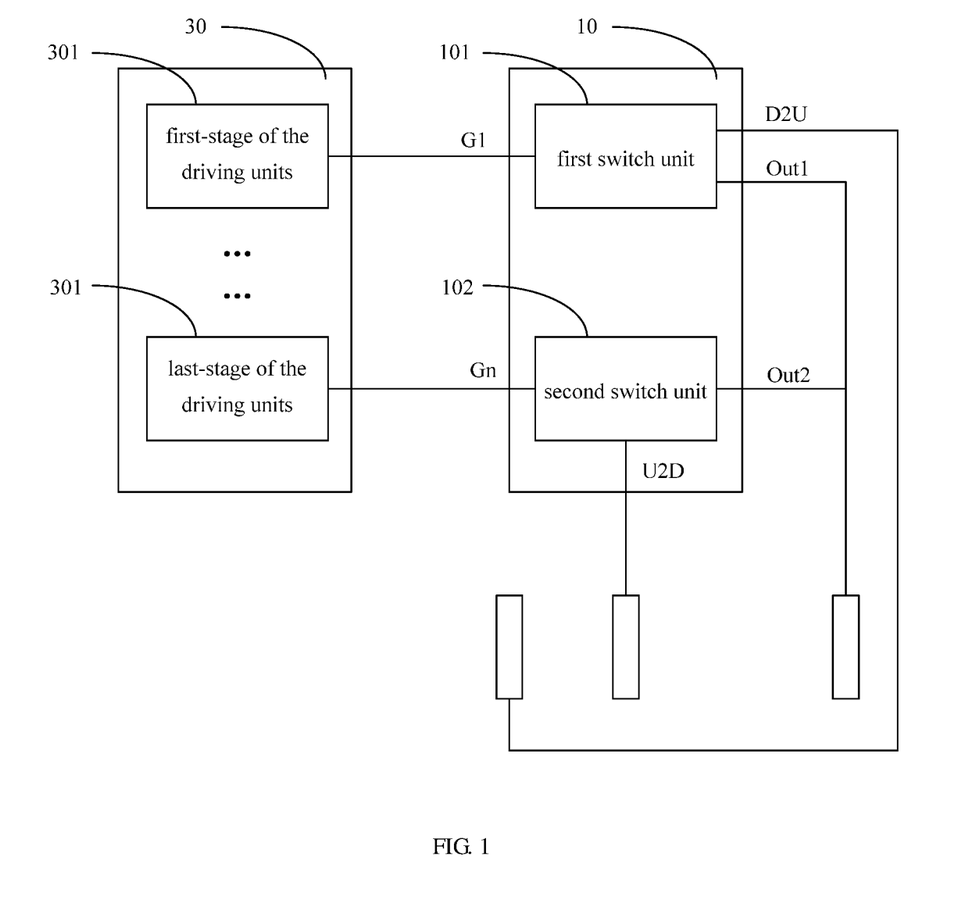
FIG. 1 is a circuit diagram of a detection signal selecting circuit according to a first embodiment of the present disclosure.

As shown in FIG. 1, a detection signal selecting circuit 10 according to a first embodiment of the present disclosure includes a first switch unit 101 and a second switch unit 102.

The detection signal selecting circuit 10 is used in a scan driving circuit of a display panel, and the detection signal selecting circuit 10 may detect a last outputted scan driving signal in each scanning, and may examine and repair a scan driving circuit when an initially outputted scan driving signal greatly differs from a last outputted scan driving signal. As shown in FIG. 1, the scan driving circuit 30 includes multi-stages (n stages) driving units 301, and each stage of the driving units 301 outputs a scan driving signal.

The first switch unit 101 includes a first control terminal D2U, a first input terminal G1, and a first output terminal Out1. The second switch unit 102 includes a second control terminal U2D, a second input terminal Gn, and a second output terminal Out2. The first output terminal Out1 connects to the second output terminal Out2 to form a final output terminal. The first input terminal G1 connects to an output terminal of a first-stage of the driving units 301, and the second input terminal Gn connects to an output terminal of a last-stage of the driving units 301.

A first control signal inputted from the first control terminal D2U controls the first switch unit 101 to be turned on or off, and a second control signal inputted from the second control terminal U2D controls the second switch unit 102 to be turned on or off, so as to selectively output an output signal of the first output terminal Out1 or an output signal of the second output terminal Out2 based on an output sequence of the scan driving signal.

The first switch unit 101 may include a controlled switching element, for example, a thin-film transistor, etc.

Specifically, when the scan driving circuit 30 performs a forward scanning, namely when the output sequence of the scan driving signal is from the first-stage of the driving units to the last-stage of the driving units, the second control signal inputted from the second control terminal U2D is utilized to control to enable the second switch unit 102, and in the meantime the first control signal inputted from the first control terminal D2U controls to disenable the first switch unit 101. At this moment, the first output terminal Out1 does not output a scan driving signal G1 outputted from the first-stage of the driving units, whereas the second output terminal Out2 may output a scan driving signal Gn outputted from the last-stage of the driving units. When the scan driving circuit 30 performs a backward scanning, namely when the output sequence of the scan driving signal is from the last-stage of the driving units to the first-stage of the driving units, the first control signal inputted from the first control terminal D2U is utilized to control to enable the first switch unit 101, and in the meantime the second control signal inputted from the second control terminal U2D controls to disenable the second switch unit 102. At this moment, the first output terminal Out1 may output a scan driving signal G1 outputted from the first-stage of the driving units, whereas the second output terminal Out2 does not output a scan driving signal Gn outputted from the last-stage of the driving units. Thus, in a bidirectional scanning, the detection signal selecting circuit 10 can select to output a last outputted scan driving signal for follow-up detection of the scan driving signal, which is advantageous to detect an exception of the scan driving circuit and thus implement timely examination and repairing.

In this embodiment, the detection signal selecting circuit may be used in a gate scan driving circuit (Scan GOA) and also may be used in a light-emitting pixel driving circuit (EM GOA), which is not specifically limited herein.

In the detection signal selecting circuit of the present disclosure, both the first switch unit and the second switch unit may adopt a thin-film transistor.

Figure 2:
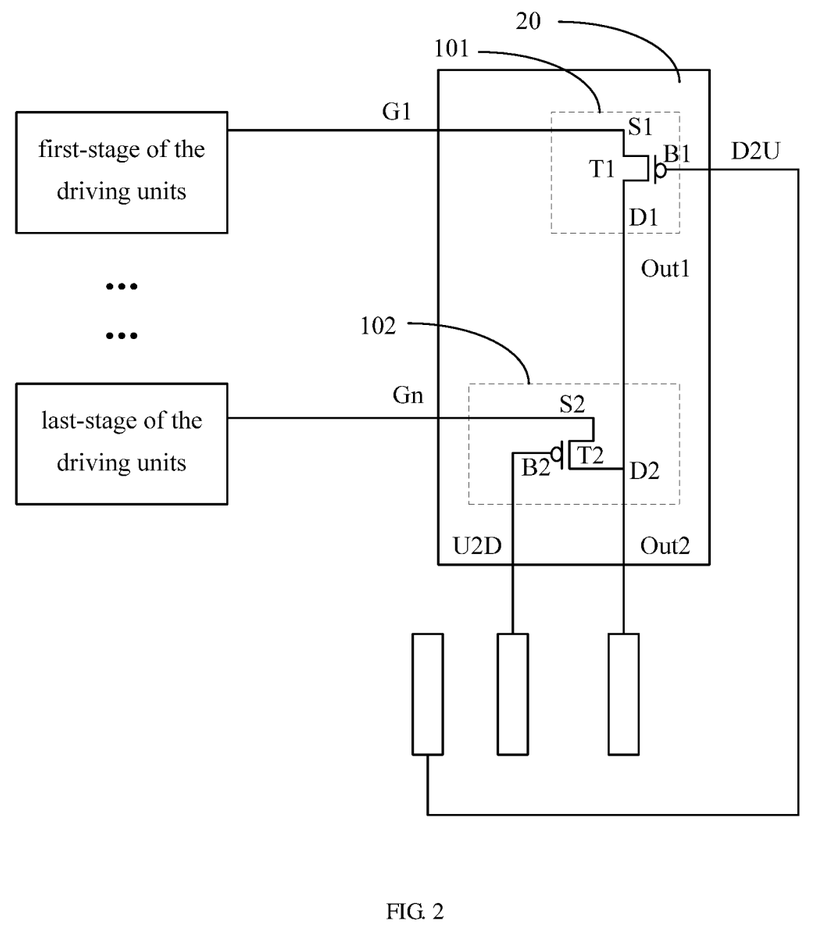
FIG. 2 is a circuit diagram of a detection signal selecting circuit according to a second embodiment of the present disclosure.

Specifically as shown in FIG. 2, the detection signal selecting circuit according to a second embodiment of the present disclosure is similar, in structure, to the detection signal selecting circuit according to the first embodiment of the present disclosure. The difference lies in that in the detection signal selecting circuit 20 of this embodiment, the first switch unit 101 includes a first thin-film transistor T1, the first thin-film transistor T1 includes a first gate B1, a first source S1, and a first drain D1. The first gate B1 connects to the first control terminal D2U, the first source S1 connects to the first input terminal G1, and the first drain D1 connects to the first output terminal Out1.

The second switch unit 102 includes a second thin-film transistor T2, which includes a second gate B2, a second source S2, and a second drain D2. The second gate B2 connects to the second control terminal U2D, the second source S2 connects to the second input terminal Gn, and the second drain D2 connects to the second output terminal Out2.

The first source S1 and the first drain D1 may be interchangeable, and the second source S2 and the second drain D2 also may be interchangeable. Both the first thin-film transistor T1 and the second thin-film transistor T2 may adopt a p-channel metal oxide semiconductor (PMOS) transistor or an n-channel metal oxide semiconductor (NMOS)

transistor, or one of them adopts the PMOS transistor, and the other one adopts the NMOS transistor, which is not specifically limited herein.

Specifically, in one application example, as shown in FIG. 2, both the first thin-film transistor T1 and the second thin-film transistor T2 adopt the PMOS transistor. When the scan driving circuit 30 performs the forward scanning, namely when the output sequence of the scan driving signal is from the first-stage of the driving units to the last-stage of the driving units, the second control signal inputted from the second control terminal U2D is a low level signal, which controls to enable the second thin-film transistor T2, and in the meantime the first control signal inputted from the first control terminal D2U is a high level signal, which controls to disenable the first thin-film transistor T1. At this moment, the first output terminal Out1 does not output the scan driving signal G1 outputted from the first-stage of the driving units, whereas the second output terminal Out2 may output the scan driving signal Gn outputted from the last-stage of the driving units. When the scan driving circuit 30 performs the backward scanning, namely when the output sequence of the scan driving signal is from the last-stage of the driving units to the first-stage of the driving units, the first control signal inputted from the first control terminal D2U is the low level signal, which controls to enable the first thin-film transistor T1, and in the meantime the second control signal inputted from the second control terminal U2D is the high level signal, which controls to disenable the second thin-film transistor T2. At this moment, the first output terminal Out1 may output the scan driving signal G1 outputted from the first-stage of the driving units, whereas the second output terminal Out2 does not output the scan driving signal Gn outputted from the last-stage of the driving units. Thus, in a bidirectional scanning, the detection signal selecting circuit 10 can select to output a last outputted scan driving signal for follow-up detection of the scan driving signal, which is advantageous to detect an exception of the scan driving circuit and thus implement timely examination and repairing.

In other embodiments, the first switch unit and the second switch unit also may adopt other switching elements, which is not specifically limited herein.

Figure 3:
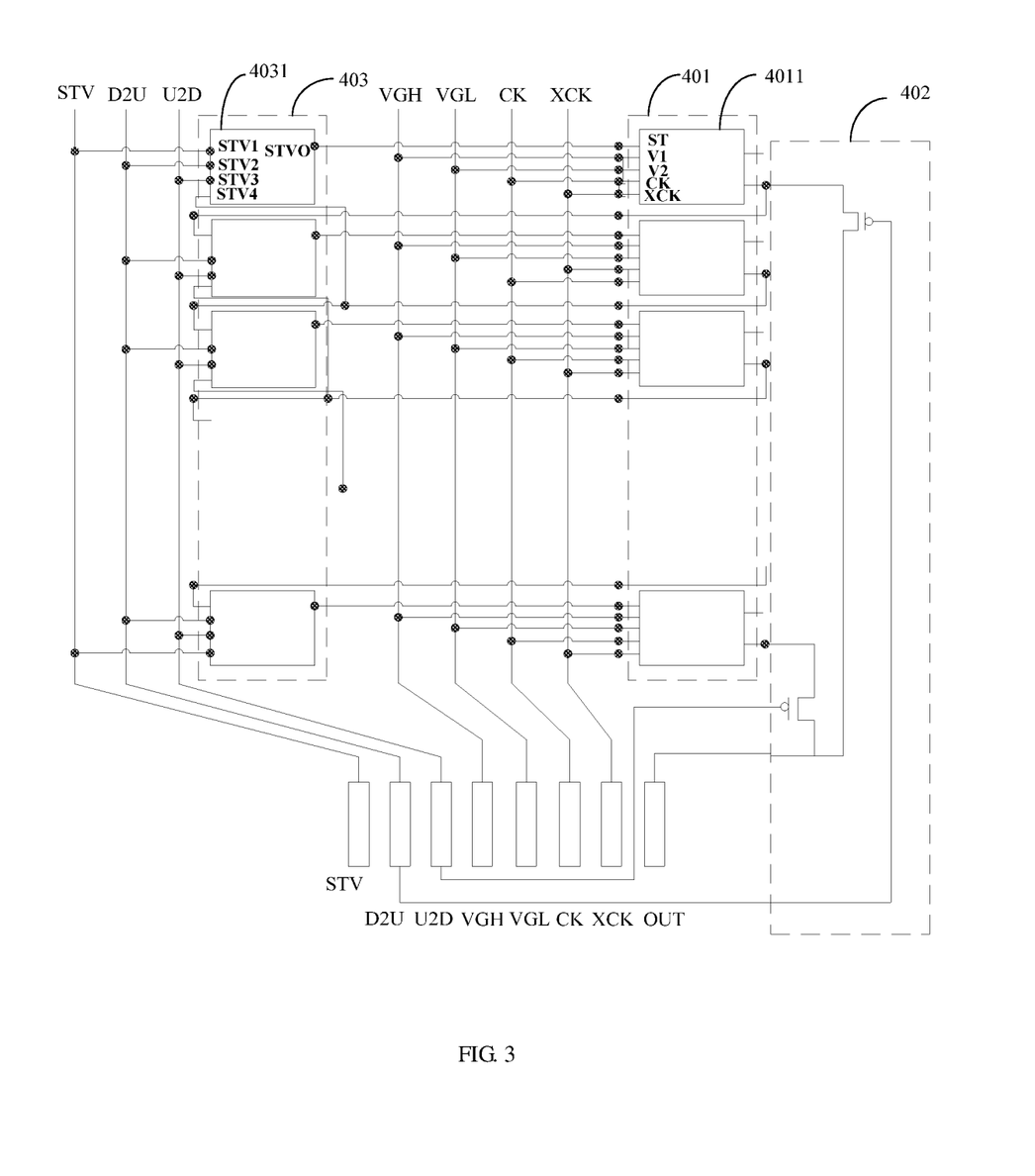
FIG. 3 is a schematic diagram of a thin film transistor substrate according to an embodiment of the present disclosure.

As shown in FIG. 3, the thin film transistor substrate according to an embodiment of the present disclosure includes a scan driving circuit 401 and a detection signal selecting circuit 402 connected to one another.

The scan driving circuit 401 includes multi-stages driving units 4011, and each stage of the driving units 4011 outputs a scan driving signal. Reference may be made to the detection signal selecting circuit according to the first or second embodiment of the present disclosure for the detection signal selecting circuit 402, description of which is not repeated herein.

Alternatively, in this embodiment, the thin film transistor substrate further includes a first power signal input terminal VGH, a second power signal input terminal VGL, a first clock signal input terminal CK, a second clock signal input terminal XCK, and a stage-shift signal output circuit 403.

Each stage of the driving units 4011 includes a stage-shift signal input terminal ST, a first driving input terminal V1, a second driving input terminal V2, a first clock input terminal CK1, a second clock input terminal CK2, and at least one driving signal output terminal G1 or G2 or . . . Gn. The stage-shift signal input terminal ST connects to the stage-shift signal output circuit 403, the first driving input terminal V1 connects to the first power signal input terminal VGH, the second driving input terminal V2 connects to the second power signal input terminal VGL, the first clock input terminal CK1 connects to the first clock signal input terminal CK, the second clock input terminal CK2 connects to the second clock signal input terminal XCK, and the driving signal output terminal G1 or G2 or . . . Gn outputs the scan driving signal. The driving signal output terminal G1 of the first-stage of the driving units 4011 connects to an input terminal of the first switch unit of the detection signal selecting circuit 402, and the driving signal output terminal Gn of the last-stage of the driving units 4011 connects to an input terminal of the second switch unit of the detection signal selecting circuit 402.

A first power signal inputted from the first power signal input terminal VGH is a high level signal, a second power signal inputted from the second power input terminal VGL is a low level signal, and a second clock signal inputted from the second clock signal input terminal XCK is a reverse signal of a first clock signal inputted from the first clock signal input terminal CK.

In this embodiment, the driving unit may adopt the existing driving circuit for bidirectional scanning, which is not specifically limited herein.

Alternatively, the thin film transistor substrate in this embodiment further includes: an initial stage-shift signal input terminal STV. The stage-shift signal output circuit 403 includes multi-stages stage-shift signal output units 4031. Each stage of the stage-shift signal output units 4031 includes a stage-shift signal first input terminal STV1, a stage-shift signal second input terminal STV2, a stage-shift signal third input terminal STV3, a stage-shift signal fourth input terminal STV4, and a stage-shift signal output terminal STVO. The stage-shift signal first input terminal STV1 connects to an output terminal Gn−1 of a previous stage of the driving units 4011. The stage-shift signal second input terminal STV2 connects to the first control signal input terminal D2U. The stage-shift signal third input terminal STV3 connects to the second control signal input terminal U2D. The stage-shift signal fourth input terminal STV4 connects to an output terminal Gn+1 of a next stage of the driving units 4011. The stage-shift signal output terminal STVO connects to the stage-shift signal input terminal ST of a corresponding stage of the driving units 4011.

The first-stage of the stage-shift signal output units does not have the corresponding previous stage of the driving units, and the last-stage of the stage-shift signal output units also does not have the corresponding next stage of the driving units. Therefore, both the stage-shift signal first input terminal STV1 of the first-stage of the stage-shift signal output units 4031 and the stage-shift signal fourth input terminal STV4 of the last-stage of the stage-shift signal output units 4031 connect to the initial stage-shift signal input terminal STV.

The stage-shift signal output circuit 403 is configured to output a stage-shift signal to each corresponding stage of the driving units 4011. When the scan driving circuit 401 performs the forward scanning, the stage-shift signal outputted from the first stage of the stage-shift signal output units is the stage-shift signal STV inputted from the initial stage-shift signal input terminal. Whereas when the scan driving circuit 401 performs the backward scanning, the stage-shift signal outputted from the last-stage of the stage-shift signal output units is the stage-shift signal STV inputted from the initial stage-shift signal input terminal.

Figure 4A:
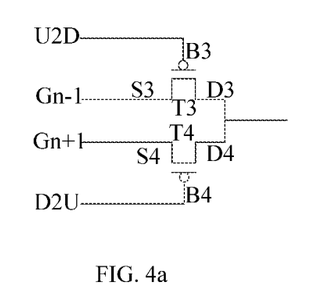
FIGS. 4a and 4b are a circuit diagram of a stage-shift signal output circuit in FIG. 3.

Alternatively, the stage-shift signal output unit 4011 may adopt the circuit as shown in FIG. 4a. The stage-shift signal output unit 4011 includes a third thin-film transistor T3 and a fourth thin-film transistor T4. The third thin-film transistor T3 includes a third gate B3, a third source S3, and a third drain D3. The third gate B3 connects to the stage-shift signal third input terminal STV3, i.e., the second control signal U2D is inputted. The third source S3 connects to the stage-shift signal first input terminal STV1, i.e., the scan driving signal Gn−1 outputted from the corresponding previous stage of the driving units is inputted. The fourth thin-film transistor T4 includes a fourth gate B4, a fourth source S4, and a fourth drain D4. The fourth gate B4 connects to the stage-shift signal second input terminal STV2, i.e., the first control signal D2U is inputted. The fourth source S4 connects to the stage-shift signal fourth input terminal STV4, i.e., the scan driving signal Gn+1 outputted from the corresponding next stage of the driving units is inputted. Both the third drain and the fourth drain connect to the stage-shift signal output terminal STVO to output a stage-shift signal.

The third source S3 and the third drain D3 may be interchangeable, and the fourth source S4 and the fourth drain D4 also may be interchangeable. Both the third thin-film transistor T3 and the fourth thin-film transistor T4 may adopt the PMOS transistor or the NMOS transistor.

Specifically, in one application example, both the third thin-film transistor T3 and the fourth thin-film transistor T4 adopt the PMOS transistor. When the scan driving circuit 401 performs the forward scanning, the U2D outputs the low level signal to enable the T3 transistor, the D2U outputs the high level signal to disenable the T4 transistor, and only the Gn−1 signal is outputted. Whereas when the scan driving circuit 401 performs the backward scanning, the U2D outputs the low level signal to enable the T4 transistor and disenable the T3 transistor, and only the Gn+1 signal is outputted.

Figure 4B:
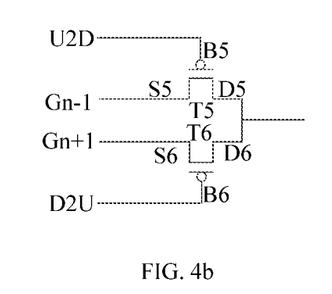

Alternatively, the stage-shift signal output unit 4011 also may adopt the circuit structure as shown in FIG. 4b. The stage-shift signal output unit 4011 includes a fifth thin-film transistor T5 and a sixth thin-film transistor T6. The fifth thin-film transistor T5 includes a fifth gate B5, a fifth source S5, and a fifth drain D5. The fifth gate B5 connects to the stage-shift signal first input terminal STV1, i.e., the scan driving signal Gn−1 outputted from the corresponding previous stage of the driving units is inputted. The fifth source S5 connects to the stage-shift signal third input terminal STV3, i.e., the second control signal U2D is inputted. The sixth thin-film transistor T6 includes a sixth gate B6, a sixth source S6, and a sixth drain D6. The sixth gate B6 connects to the stage-shift signal fourth input terminal STV2, i.e., the scan driving signal Gn+1 outputted from the corresponding next stage of the driving units is inputted. The sixth source S6 connects to the stage-shift signal second input terminal, i.e., the first control signal D2U is inputted. The fifth drain D5 and the sixth drain D6 connect to the stage-shift signal output terminal STVO to output a stage-shift signal.

The fifth source S5 and the fifth drain D5 may be interchangeable, and the sixth source S6 and the sixth drain D6 also may be interchangeable. Both the fifth thin-film transistor T5 and the sixth thin-film transistor T6 may adopt the PMOS transistor or the NMOS transistor. Working processes of T5 and T6 are similar to those of T3 and T4, and thus are not repeated any more herein.

Figure 5:
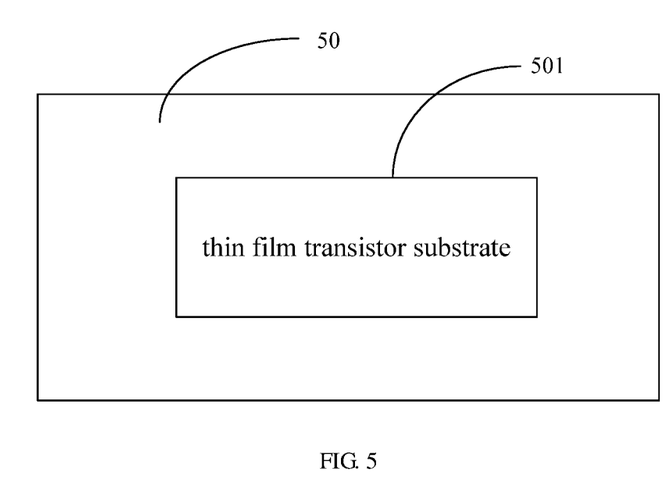
FIG. 5 is a schematic diagram of a display panel according to an embodiment of the present disclosure.

As shown in FIG. 5, a display panel 50 according to an embodiment of the present disclosure at least includes a thin film transistor substrate 501. Reference may be made to the structure of the thin film transistor substrate according to an embodiment of the present disclosure for the thin film transistor substrate 501, description of which is not repeated herein. The display panel 50 may be an organic light emitting display (OLED) such as an active matrix organic light emitting display (AMOLED), or may be a liquid crystal display (LCD).

In this embodiment, based on its type, the display panel may further include a color filter substrate, liquid crystal or other components, which are not specifically limited herein.

In this embodiment, in the thin film transistor substrate of the display panel, by way of a selective switch of a first switch unit and a selective switch of a second switch unit, the detection signal selecting circuit may selectively output an output signal of the first output terminal or an output signal of the second output terminal based on an output sequence of the scan driving signal. The output signal of the first output terminal is a scan driving signal outputted from the first-stage of the driving units, and the output signal of the second output terminal is a scan driving signal outputted from the last-stage of the driving units. The detection signal selecting circuit may select to enable the second switch unit to output the scan driving signal outputted from the last-stage of the driving units when performing a forward scanning, namely when the output sequence of the scan driving signal is from the first-stage of the driving units to the last-stage of the driving units. Whereas the detection signal selecting circuit may select to enable the first switch unit to output the scan driving signal outputted from the first-stage of the driving units when performing a backward scanning In this way, the last outputted scan driving signal can be outputted in bidirectional scanning (i.e., the forward scanning and the backward scanning), and thus detection of the scan driving circuit in bidirectional scanning may be implemented.

Figure 6:
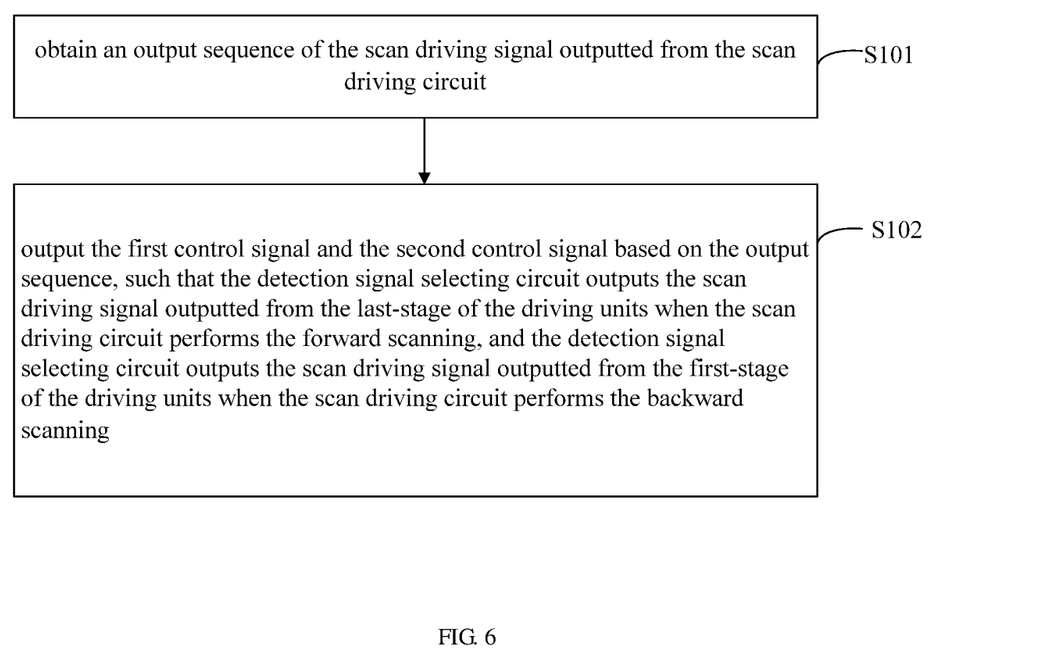
FIG. 6 is a flow diagram of a detection signal selecting method according to an embodiment of the present disclosure.

As shown in FIG. 6, a method for selecting a detection signal according to an embodiment of the present disclosure is used in the thin film transistor substrate according to an embodiment of the present disclosure. In this embodiment, the method includes:

S101: obtaining an output sequence of the scan driving signal outputted from the scan driving circuit; and S102: outputting the first control signal and the second control signal based on the output sequence, such that the detection signal selecting circuit outputs the scan driving signal outputted from the last-stage of the driving units when the scan driving circuit performs the forward scanning, and the detection signal selecting circuit outputs the scan driving signal outputted from the first-stage of the driving units when the scan driving circuit performs the backward scanning.

Reference may be made to the working processes of the detection signal selecting circuit according to an embodiment of the present disclosure or to contents of the first or second embodiment of the detection signal selecting circuit according to the present disclosure for concrete implementation processes of the above steps, which are not repeated any more herein.

The above are merely embodiments of the present disclosure and are not intended to limit the patent scope of the present disclosure. Any modifications of equivalent structure or equivalent process made on the basis of the contents of the description and accompanying drawings of the present disclosure or directly or indirectly applied to other related technical fields shall similarly fall within the scope of patent protection of the present disclosure.

What is claimed is:

1. A detection signal selecting circuit, used in a scan driving circuit of a display panel, the scan driving circuit comprising multi-stages driving units, each stage of the driving units outputting a scan driving signal, wherein the detection signal selecting circuit comprises:
  a first switch unit and a second switch unit, the first switch unit comprising a first control terminal, a first input terminal, and a first output terminal, the second switch unit comprising a second control terminal, a second input terminal, and a second output terminal, the first output terminal connecting to the second output terminal, the first input terminal connecting to an output terminal of a first-stage of the driving units, and the second input terminal connecting to an output terminal of a last-stage of the driving units;
  wherein a first control signal inputted from the first control terminal controls the first switch unit to be turned on or off, and a second control signal inputted from the second control terminal controls the second switch unit to be turned on or off, to selectively output an output signal of the first output terminal or an output signal of the second output terminal based on an output sequence of the scan driving signal;
  wherein the first switch unit comprises a first thin-film transistor, the first thin-film transistor comprises a first gate, a first source, and a first drain, the first gate connects to the first control terminal, the first source or the first drain connects to the first input terminal, and another one of the first source and the first drain connects to the first output terminal; and
  wherein the second switch unit comprises a second thin-film transistor, the second thin-film transistor comprises a second gate, a second source, and a second drain, the second gate connects to the second control terminal, the second source or the second drain connects to the second input terminal, and another one of the second source and the second drain connects to the second output terminal.

2. The detection signal selecting circuit according to claim 1, wherein the scan driving circuit is a gate scan driving circuit or a light-emitting pixel driving circuit.

3. The detection signal selecting circuit according to claim 1, wherein the first thin-film transistor is a p-channel metal oxide semiconductor (PMOS) transistor or an n-channel metal oxide semiconductor (NMOS) transistor.

4. The detection signal selecting circuit according to claim 1, wherein the second thin-film transistor is a PMOS transistor or an NMOS transistor.

5. A thin film transistor substrate, comprising a scan driving circuit and a detection signal selecting circuit connected to one another;
  wherein the scan driving circuit comprises multi-stages driving units, and each stage of the driving units outputs a scan driving signal;
  wherein the detection signal selecting circuit comprises: a first switch unit and a second switch unit, the first switch unit comprises a first control terminal, a first input terminal, and a first output terminal, the second switch unit comprises a second control terminal, a second input terminal, and a second output terminal, the first output terminal connects to the second output terminal, the first input terminal connects to an output terminal of a first-stage of the driving units, and the second input terminal connects to an output terminal of a last-stage of the driving units; and
  wherein a first control signal inputted from the first control terminal controls the first switch unit to be turned on or off, and a second control signal inputted from the second control terminal controls the second switch unit to be turned on or off, to selectively output an output signal of the first output terminal or an output signal of the second output terminal based on an output sequence of the scan driving signal.

6. The thin film transistor substrate according to claim 5, wherein the first switch unit comprises a first thin-film transistor, the first thin-film transistor comprises a first gate, a first source, and a first drain, the first gate connects to the first control terminal, the first source or the first drain connects to the first input terminal, and another one of the first source and the first drain connects to the first output terminal.

7. The thin film transistor substrate according to claim 5, wherein the second switch unit comprises a second thin-film transistor, the second thin-film transistor comprises a second gate, a second source, and a second drain, the second gate connects to the second control terminal, the second source or the second drain connects to the second input terminal, and another one of the second source and the second drain connects to the second output terminal.

8. The thin film transistor substrate according to claim 5, further comprising: a first power signal input terminal, a second power signal input terminal, a first clock signal input terminal, a second clock signal input terminal, and a stage-shift signal output circuit; wherein each stage of the driving units comprises a stage-shift signal input terminal, a first driving input terminal, a second driving input terminal, a first clock input terminal, a second clock input terminal, and a driving signal output terminal, the stage-shift signal input terminal connects to the stage-shift signal output circuit, the first driving input terminal connects to the first power signal input terminal, the second driving input terminal connects to the second power signal input terminal, the first clock input terminal connects to the first clock signal input terminal, the second clock input terminal connects to the second clock signal input terminal, and the driving signal output terminal outputs the scan driving signal; and
  wherein a first power signal inputted from the first power signal input terminal is opposite, in electric potential, to a second power signal inputted from the second power input terminal, and a first clock signal inputted from the first clock signal input terminal is opposite, in electric potential, to a second clock signal inputted from the second clock signal input terminal.

9. The thin film transistor substrate according to claim 8, further comprising: an initial stage-shift signal input terminal;
  wherein the stage-shift signal output circuit comprises multi-stages stage-shift signal output units, each stage of the stage-shift signal output units comprises a stage-shift signal first input terminal, a stage-shift signal second input terminal, a stage-shift signal third input terminal, a stage-shift signal fourth input terminal, and a stage-shift signal output terminal, the stage-shift signal first input terminal connects to an output terminal of a previous stage of the driving units, the stage-shift signal second input terminal connects to the first control signal input terminal, the stage-shift signal third input terminal connects to the second control signal input terminal, the stage-shift signal fourth input terminal connects to an output terminal of a next stage of the driving units, and the stage-shift signal output terminal connects to the stage-shift signal input terminal of a corresponding stage of the driving units; and
  wherein both the stage-shift signal first input terminal of a first-stage of the stage-shift signal output units and the stage-shift signal fourth input terminal of a last-stage of the stage-shift signal output units connect to the initial stage-shift signal input terminal.

10. The thin film transistor substrate according to claim 9, wherein the stage-shift signal output unit comprises a third thin-film transistor and a fourth thin-film transistor, the third thin-film transistor comprises a third gate, a third source, and a third drain, the third gate connects to the stage-shift signal third input terminal, the third source or the third drain connects to the stage-shift signal first input terminal, the fourth thin-film transistor comprises a fourth gate, a fourth source, and a fourth drain, the fourth gate connects to the stage-shift signal second input terminal, the fourth source or the fourth drain connects to the stage-shift signal fourth input terminal, and both another one of the third source and the third drain and another one of the fourth source and the fourth drain connect to the stage-shift signal output terminal.

11. The thin film transistor substrate according to claim 9, wherein the stage-shift signal output unit comprises a fifth thin-film transistor and a sixth thin-film transistor, the fifth thin-film transistor comprises a fifth gate, a fifth source, and a fifth drain, the fifth gate connects to the stage-shift signal first input terminal, the fifth source or the fifth drain connects to the stage-shift signal third input terminal, the sixth thin-film transistor comprises a sixth gate, a sixth source, and a sixth drain, the sixth gate connects to the stage-shift signal fourth input terminal, the sixth source or the sixth drain connects to the stage-shift signal second input terminal, and both another one of the fifth source and the fifth drain and another one of the sixth source and the sixth drain connect to the stage-shift signal output terminal.

12. The thin film transistor substrate according to claim 5, wherein the scan driving circuit is a gate scan driving circuit or a light-emitting pixel driving circuit.

13. The thin film transistor substrate according to claim 5, wherein the first thin-film transistor or the second thin-film transistor is a PMOS transistor or an NMOS transistor.

14. A display panel, at least comprising a thin film transistor substrate;
wherein the thin film transistor substrate comprises a scan driving circuit and a detection signal selecting circuit connected to one another;
wherein the scan driving circuit comprises multi-stages driving units, and each stage of the driving units outputs a scan driving signal;
wherein the detection signal selecting circuit comprises: a first switch unit and a second switch unit, the first switch unit comprises a first control terminal, a first input terminal, and a first output terminal, the second switch unit comprises a second control terminal, a second input terminal, and a second output terminal, the first output terminal connects to the second output terminal, the first input terminal connects to an output terminal of a first-stage of the driving units, and the second input terminal connects to an output terminal of a last-stage of the driving units; and
wherein a first control signal inputted from the first control terminal controls the first switch unit to be turned on or off, and a second control signal inputted from the second control terminal controls the second switch unit to be turned on or off, to selectively output an output signal of the first output terminal or an output signal of the second output terminal based on an output sequence of the scan driving signal.

15. The display panel according to claim 14, wherein the first switch unit comprises a first thin-film transistor, the first thin-film transistor comprises a first gate, a first source, and a first drain, the first gate connects to the first control terminal, the first source or the first drain connects to the first input terminal, and another one of the first source and the first drain connects to the first output terminal.

16. The display panel according to claim 14, wherein the second switch unit comprises a second thin-film transistor, the second thin-film transistor comprises a second gate, a second source, and a second drain, the second gate connects to the second control terminal, the second source or the second drain connects to the second input terminal, and another one of the second source and the second drain connects to the second output terminal.

17. The display panel according to claim 16, wherein the thin film transistor substrate further comprises: a first power signal input terminal, a second power signal input terminal, a first clock signal input terminal, a second clock signal input terminal, and a stage-shift signal output circuit; each stage of the driving units comprises a stage-shift signal input terminal, a first driving input terminal, a second driving input terminal, a first clock input terminal, a second clock input terminal, and a driving signal output terminal, the stage-shift signal input terminal connects to the stage-shift signal output circuit, the first driving input terminal connects to the first power signal input terminal, the second driving input terminal connects to the second power signal input terminal, the first clock input terminal connects to the first clock signal input terminal, the second clock input terminal connects to the second clock signal input terminal, and the driving signal output terminal outputs the scan driving signal; and
wherein a first power signal inputted from the first power signal input terminal is opposite, in electric potential, to a second power signal inputted from the second power input terminal, and a first clock signal inputted from the first clock signal input terminal is opposite, in electric potential, to a second clock signal inputted from the second clock signal input terminal.

18. The display panel according to claim 16, wherein the thin film transistor substrate further comprises: an initial stage-shift signal input terminal;
the stage-shift signal output circuit comprises multi-stages stage-shift signal output units, each stage of the stage-shift signal output units comprises a stage-shift signal first input terminal, a stage-shift signal second input terminal, a stage-shift signal third input terminal, a stage-shift signal fourth input terminal, and a stage-shift signal output terminal, the stage-shift signal first input terminal connects to an output terminal of a previous stage of the driving units, the stage-shift signal second input terminal connects to the first control signal input terminal, the stage-shift signal third input terminal connects to the second control signal input terminal, the stage-shift signal fourth input terminal connects to an output terminal of a next stage of the driving units, and the stage-shift signal output terminal connects to the stage-shift signal input terminal of a corresponding stage of the driving units; and
wherein both the stage-shift signal first input terminal of a first-stage of the stage-shift signal output units and the stage-shift signal fourth input terminal of a last-stage of the stage-shift signal output units connect to the initial stage-shift signal input terminal.

19. The display panel according to claim 18, wherein the stage-shift signal output unit comprises a third thin-film transistor and a fourth thin-film transistor, the third thin-film transistor comprises a third gate, a third source, and a third drain, the third gate connects to the stage-shift signal third input terminal, the third source or the third drain connects to the stage-shift signal first input terminal, the fourth thin-film transistor comprises a fourth gate, a fourth source, and a fourth drain, the fourth gate connects to the stage-shift signal second input terminal, the fourth source or the fourth drain connects to the stage-shift signal fourth input terminal, and both another one of the third source and the third drain and another one of the fourth source and the fourth drain connect to the stage-shift signal output terminal.

20. The display panel according to claim 18, wherein the stage-shift signal output unit comprises a fifth thin-film transistor and a sixth thin-film transistor, the fifth thin-film transistor comprises a fifth gate, a fifth source, and a fifth drain, the fifth gate connects to the stage-shift signal first input terminal, the fifth source or the fifth drain connects to the stage-shift signal third input terminal, the sixth thin-film transistor comprises a sixth gate, a sixth source, and a sixth drain, the sixth gate connects to the stage-shift signal fourth input terminal, the sixth source or the sixth drain connects to the stage-shift signal second input terminal, and both another one of the fifth source and the fifth drain and another one of the sixth source and the sixth drain connect to the stage-shift signal output terminal.

\* \* \* \* \*